Jan. 14, 1969 A. G. BAKER ET AL 3,421,206

METHOD OF FORMING LEADS ON SEMICONDUCTOR DEVICES

Filed Oct. 19, 1965 Sheet 1 of 8

INVENTORS
ALLEN G. BAKER and
ROBERT C. INGRAHAM

BY David M. Keay

AGENT.

INVENTORS.
ALLEN G. BAKER and
ROBERT C. INGRAHAM

BY David M. Keay

AGENT.

METHOD OF FORMING LEADS ON SEMICONDUCTOR DEVICES

INVENTORS.
ALLEN G. BAKER and
ROBERT C. INGRAHAM

BY David M. Keay
AGENT.

INVENTORS.
ALLEN G. BAKER and
ROBERT C. INGRAHAM
BY David M. Keay
AGENT.

INVENTORS.
ALLEN G. BAKER and
ROBERT C. INGRAHAM

BY David M Keay
AGENT.

METHOD OF FORMING LEADS ON SEMICONDUCTOR DEVICES

Filed Oct. 19, 1965

INVENTORS.
ALLEN G. BAKER and
ROBERT C. INGRAHAM

BY David M. Keay
AGENT.

INVENTORS.
ALLEN G. BAKER and
ROBERT C. INGRAHAM

BY David M. Keay

AGENT.

INVENTORS
ALLEN G. BAKER and
ROBERT C. INGRAHAM
BY David M. Kay
AGENT.

3,421,206
METHOD OF FORMING LEADS ON SEMICONDUCTOR DEVICES

Allen G. Baker, Waltham, and Robert C. Ingraham, Topsfield, Mass., assignors to Sylvania Electric Products Inc., a corporation of Delaware Filed Oct. 19, 1965, Ser. No. 497,654
U.S. Cl. 29—589 6 Claims
Int. Cl. H01l 7/02

ABSTRACT OF THE DISCLOSURE

Methods of forming supporting leads (beam leads) on certain areas of a semiconductor wafer by covering the wafer with aluminum and then copper. Removing the copper and aluminum from the desired areas by photoresist masking and etching techniques. Etching the exposed edges of the copper to expose more of the aluminum. Covering the wafer with titanium and platinum. Dissolving the copper which also removes the overlying titanium and platinum. Oxidizing the exposed aluminum and then electroplating with gold whereby gold plates onto the remaining titanium and platinum to form leads at the desired areas. Then dissolving the aluminum.

Figure 1:
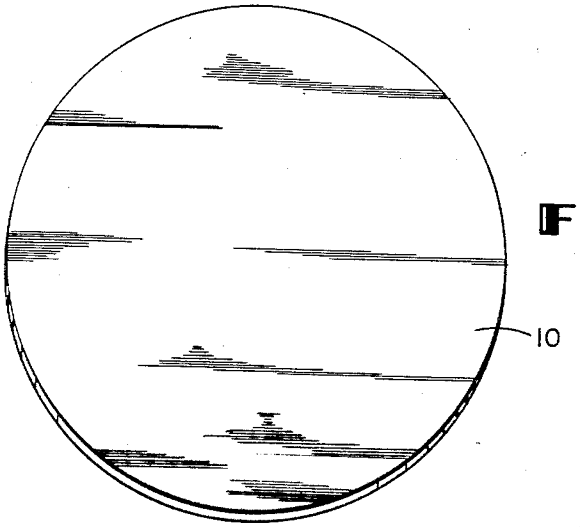

This invention relates to semiconductor electrical translating devices. More particularly, it is concerned with methods of producing semiconductor devices having conductive leads affixed to the bodies of semiconductor material in which the electrically active elements of the devices are fabricated.

Semiconductor devices of the type formed by diffusion of conductivity type imparting materials into a body of semiconductor material typically have been mounted on a suitable header or support and the electrically active regions of the body have been connected to the header leads by small contact wires. The contact wires are attached to the header leads and to the ohmic contacts on the body of semiconductor material by known techniques of thermal compression bonding or welding. This method of mounting bodies of semiconductor material and connecting to external leads has been employed in the production of individual components and also in the production of integrated circuit networks having several components incorporated in a single body of semiconductor material. Interconnections between the components of an integrated circuit network have been formed by thin films of metal, such as aluminum, which adhere to the non-conductive protective coating on the surface of the semiconductor body.

Recently there has been developed a method of forming relatively heavy supporting leads which adhere to the body of semiconductor material and are suitable for providing connections to external leads and also interconnections between components of an integrated circuit network. The leads are fabricated on the surface of a wafer of semiconductor material and portions of the wafer are removed to leave a body of semiconductor material containing the active elements of the device with portions of the leads adhering to the surface of the body and other portions extending outward from the body. The outwardly extending portions may be directly connected, as by welding, to header leads.

In the fabrication of integrated circuit networks semiconductor material between the individual components or groups of components may be removed subsequent to formation of the leads to provide a plurality of bodies of semiconductor material supported in fixed relationship with respect to each other by the heavy supporting leads.

The components within each body are thus electrically isolated from those within every other body.

The supporting leads are formed on a wafer of semiconductor material after the active regions have been produced by diffusion and the surface of the wafer has been covered with an adherent non-conductive protective coating having openings exposing areas at which electrical contact is to be made by the leads. The leads are fabricated in a series of steps employing various materials in succession in order to delineate the pattern of the leads, provide for adherence of the leads to the wafer, and build up the leads to satisfactory thickness. An electroplating technique is employed to build up the leads. The regions being plated are electrically connected to each other by conductive material on the surface of the wafer. The conductive material is covered with a nonconductive coating during the plating process and is removed from the wafer subsequent to the plating step.

The materials and procedures employed at each step in the process must be compatible with those employed in succeeding steps. Because of these requirements there are many problems in fabricating supporting leads. Certain of the process steps are particularly difficult to control. For example, removal from the wafer surface of the conductive material which provides electrical connections during plating is commonly achieved by a combination of sputtering away and etching techniques. The conditions required for these operations may cause deterioration of the completed leads.

One improved method of producing supporting leads on semiconductor devices which avoids many of the difficulties of previously known methods and, in particular, which obviates the need for the above-mentioned manner of removal of the conductive material providing electrical connections during plating, is disclosed and claimed in our copending application Ser. No. 498,039 filed Oct. 19, 1965, the same date as the present application, and assigned to the assignee of the present invention. In the invention of the present application, we have provided still another method for forming supporting leads which also does not require the sputtering away of the conductive material providing electrical connections during electroplating and offers advantages in other respects as will be brought out below.

It is an object of the present invention, therefore, to provide an improved method for producing semiconductor devices.

It is another object of the invention to provide an improved method for forming supporting leads on a body of semiconductor material.

It is also an object of the invention to provide a method for electroplating supporting leads on a body of semiconductor material in which temporary contacts provided between the regions being plated are readily removed subsequent to completion of the leads without damage to the leads.

It is a further object of the invention to provide an improved method for forming supporting leads on a body of semiconductor material in which the number of processing steps requiring precise alignment is minimized.

Briefly, in accordance with the foregoing objects of the invention supporting leads are formed on a surface of a body of semiconductor material which is covered with an adherent layer of a non-conductive material having openings exposing underlying regions of the semiconductor body. Conductive contacts make ohmic connection to the semiconductor material at each opening in the layer of non-conductive material.

A first layer of a first conductive material and an overlying second layer of material are placed on predetermined portions of the surface of the layer of non-conductive material leaving exposed other portions of the surface of the layer of non-conductive material and at least portions of the conductive contacts. Since, as will be apparent, the first and second layers do not constitute parts of the finished device, they may be designated as a first temporary layer and a second temporary layer, respectively. The exposed portions of the surface of the non-conductive coating and the conductive contacts delineate the areas on which the conductive supporting leads are to be formed. The two temporary layers each have edges bordering the exposed portions of the surface of the layer of non-conductive material and the conductive contacts.

Portions of the second temporary layer at the edges bordering the exposed portions of the surface of the layer of non-conductive material and the conductive contacts are removed to expose peripheral portions of the surface of the first temporary layer adjacent the edges of the first temporary layer. Then, conductive material is placed on the exposed portions of the surface of the layer of non-conductive material and the conductive contacts, on the exposed peripheral portions of the surface of the first temporary layer, and on the surface of the second temporary layer.

The assembly is subjected to etching material which is capable of dissolving material of the second temporary layer but not the other exposed materials of the assembly in order to remove the second temporary layer and the overlying conductive material. A plurality of segments of conductive material remain on the aforementioned portions of the surface of the layer of non-conductive material and the conductive contacts and on the peripheral portions of the surface of the first temporary layer.

Next, a non-conductive coating is formed on the exposed surface of the first temporary layer of first conductive material. Then, conductive material is electroplated onto the exposed conductive material of the assembly. During the electroplating process the first conductive material of the first temporary layer provides electrical contact to every segment. Since the portions of the surface of the first temporary layer which are not covered by the segments are covered by a non-conductive coating and since the surfaces of the conductive segments are exposed, conductive material plates onto the segments. Plating is carried out until relatively thick conductive members overlie the segments. Upon completion of the plating the first temporary layer together with its non-conductive coating is removed.

Figure 1A:
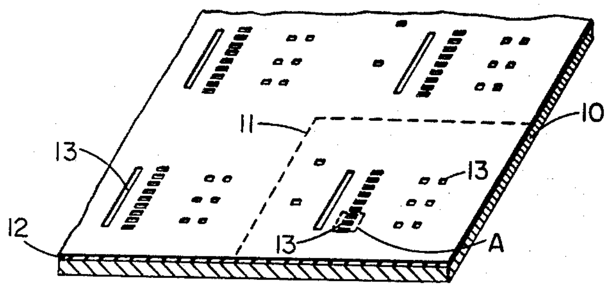
Figure 1B:
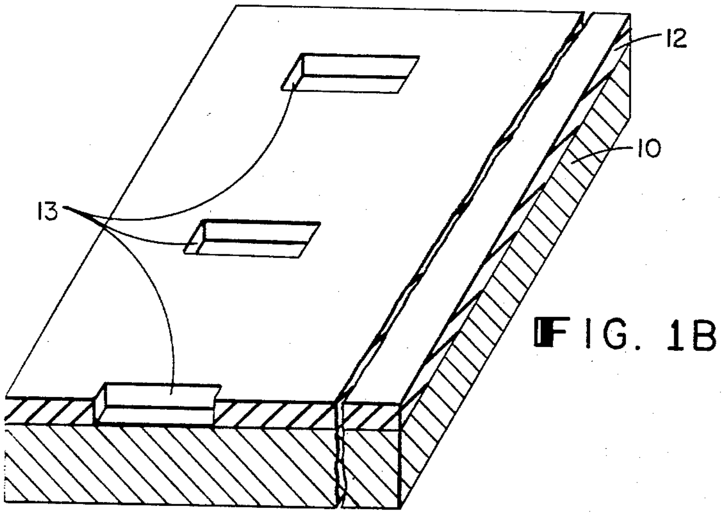
Figure 14:
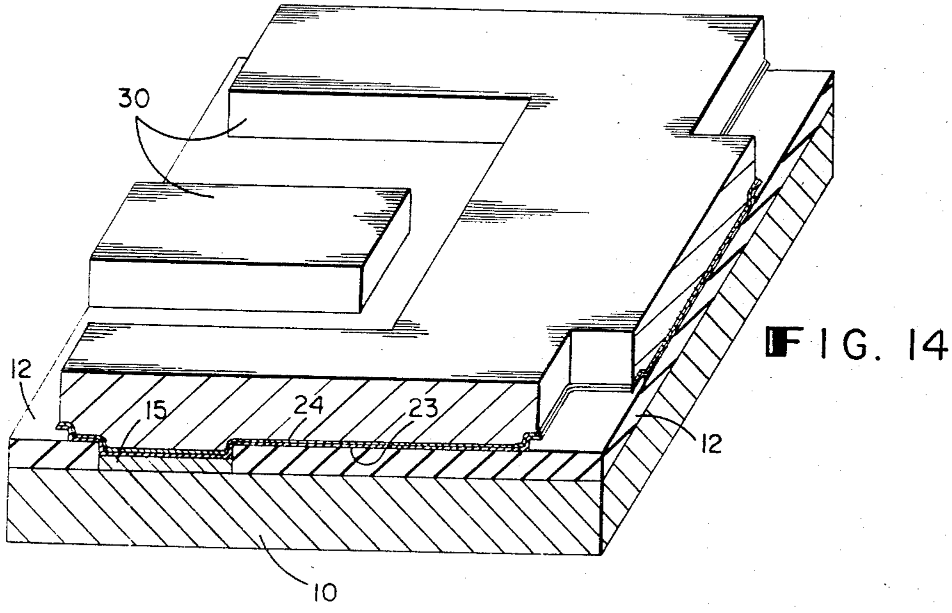
Figure 15:
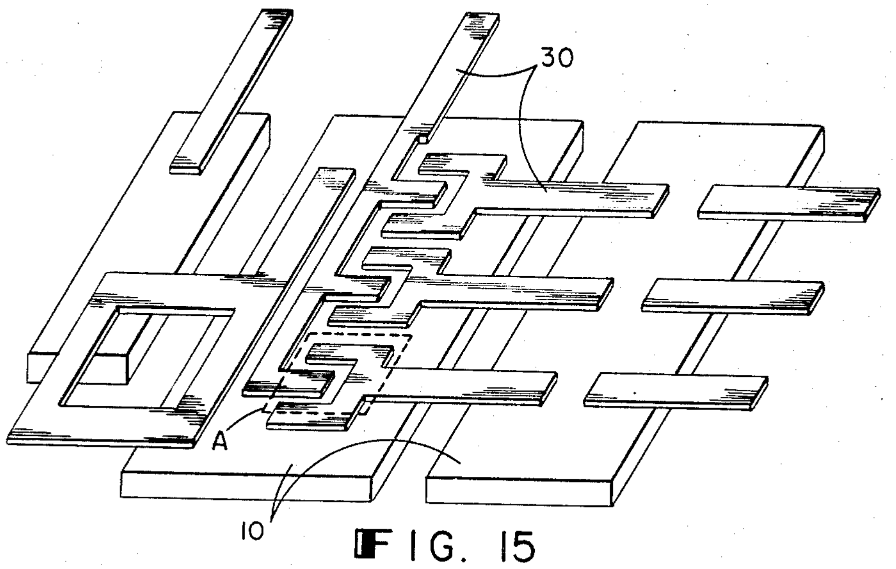

Additional objects, features, and advantages of the method of the invention will be apparent from the following detailed discussion and the accompanying drawings wherein:

FIG. 1 is a perspective view of a wafer of semiconductor material within which the components of a plurality of integrated circuits have been formed by diffusion and onto which supporting leads are to be formed in accordance with the method of the invention, FIG. 1A is a perspective view in cross-section of a fragment of the wafer of FIG. 1 showing the coating of non-conductive material and the openings in the coating to which contacts are to be made by supporting leads, FIG. 1B is a perspective view in cross-section of the portion of the fragment of FIG. 1A delineated by the dashed lines labeled "A" in FIG. 1A, FIGS. 2 through 14 are perspective views in cross-section of the portion of the wafer shown in FIG. 1B illustrating various stages in the fabrication of supporting leads in accordance with the invention, and FIG. 15 is a perspective view of an integrated circuit network having supporting leads fabricated in accordance with the invention.

Because of the extremely small size of various portions of the elements illustrated in the drawings, some of the dimensions of many of the elements have been exaggerated with respect to other dimensions, It is believed that greater clarity of presentation is thereby obtained despite consequent distortion of elements in relation to their actual physical appearance.

In the fabrication of semiconductor devices of the diffused type either as individual components or as a group of components in the form of an integrated circuit network hundreds of devices are produced at one time in a wafer of semiconductor material of relatively large surface area. At a certain stage in the production of the devices the wafer is broken up into individual components or individual circuit networks for attaching or mounting in a suitable enclosure.

A wafer of silicon 10 having a plurality of identical integrated circuit networks each including several components formed by diffusion of conductivity type imparting materials into the wafer is shown in FIG. 1, and an enlarged view of a fragment of the wafer is shown in FIG. 1A. A section of the wafer containing the components of a single integrated circuit network is indicated by the broken line 11 in FIG. 1A. The upper flat major surface of the wafer is covered by silicon oxide 12 which forms an adherent non-conductive protective coating over the surface. Openings 13 in the oxide expose areas of the silicon surface at regions of the wafer to which electrical connections are to be made. The wafer as illustrated is produced by the well-known processes of diffusing conductivity type imparting materials through openings in oxide coatings which are defined by photoresist masking and etching techniques.

FIG. 1B shows a small portion of the silicon slice indicated by the dashed lines labeled A in FIG. 1A. This same portion is shown in FIGS. 2 through 14 during various stages of the method of fabricating supporting leads according to the invention.

Figures 2, 3:
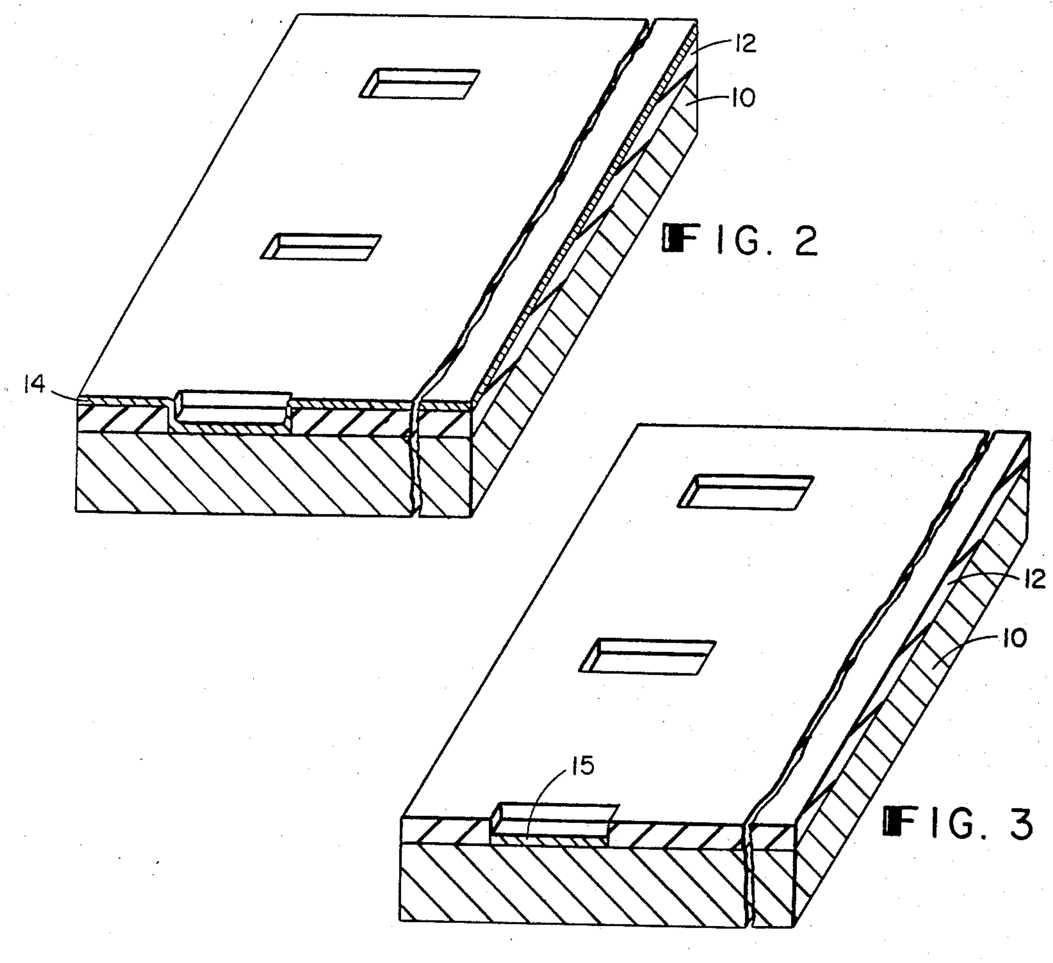

As shown in FIG. 1B the surface of the silicon wafer 10 is covered with an adherent layer of silicon oxide 12 having openings 13 exposing surface areas of the silicon. A conductive contact is formed in each of the openings to make ohmic connection to the exposed silicon. The ohmic contacts may be formed by placing the silicon wafer in a suitable apparatus and sputtering platinum onto the upper surface. As shown in FIG. 2 a layer of platinum 14 approximately 225 angstrom units thick is deposited on the surface of the oxide coating 12 and on the exposed areas of the silicon. The temperature of the silicon wafer is raised to approximately 700° C. without removing it from the sputtering apparatus causing the platinum within the openings to combine with the silicon and form platinum silicide. The platinum in contact with the oxide is not affected. The procedure of sputtering on a layer of platinum approximately 225 angstrom units thick and heating to approximately 700° C. is repeated twice.

The wafer is immersed in a standard aqua regia solution of 1 part nitric acid and 3 parts hydrochloric acid for a period of about 6 minutes. The aqua regia solution dissolves the platinum, but does not attack the silicon, the silicon oxide, or the platinum silicide. The platinum silicide adheres to the silicon and forms an ohmic conductive contact 15 as shown in FIG. 3.

Figure 4:
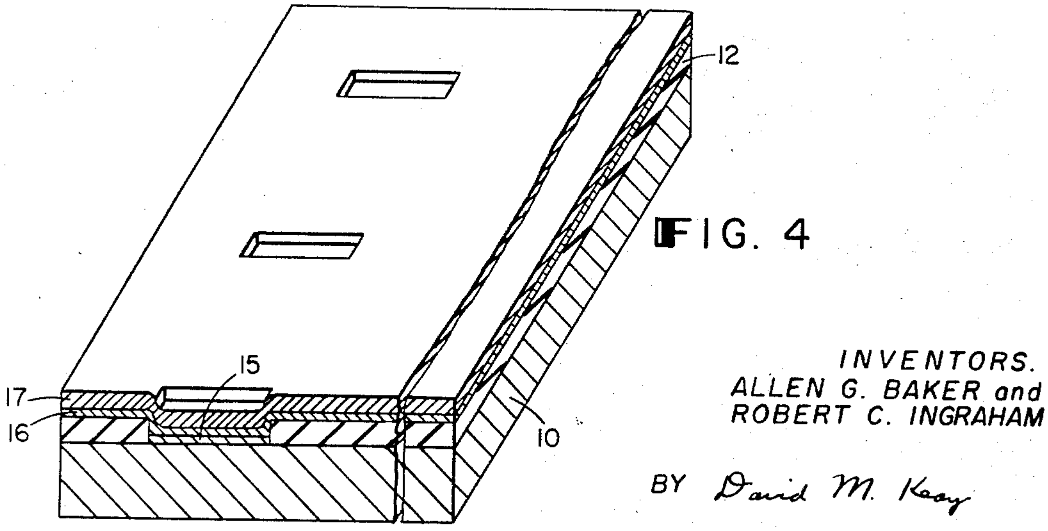

Next, as shown in FIG. 4, a layer of conductive material 16 is deposited over the surface of the silicon oxide and the platinum silicide contacts. Since, as will be apparent, the layer will not constitute a part of the finished device it may be designated a temporary layer. The layer is formed by placing the wafer in a standard vacuum evaporation apparatus and vapor depositing aluminum in a layer approximately 1,500 angstrom units thick. Then material is deposited to form an adherent second temporary layer 17 on the surface of the first temporary layer 16. The second temporary layer is produced by vapor depositing copper approximately 8,000 angstrom units thick. For purposes which will be explained hereinafter the second temporary layer may also include a film of aluminum of the order of 500 angstrom units thick deposited on the copper.

Figure 5:
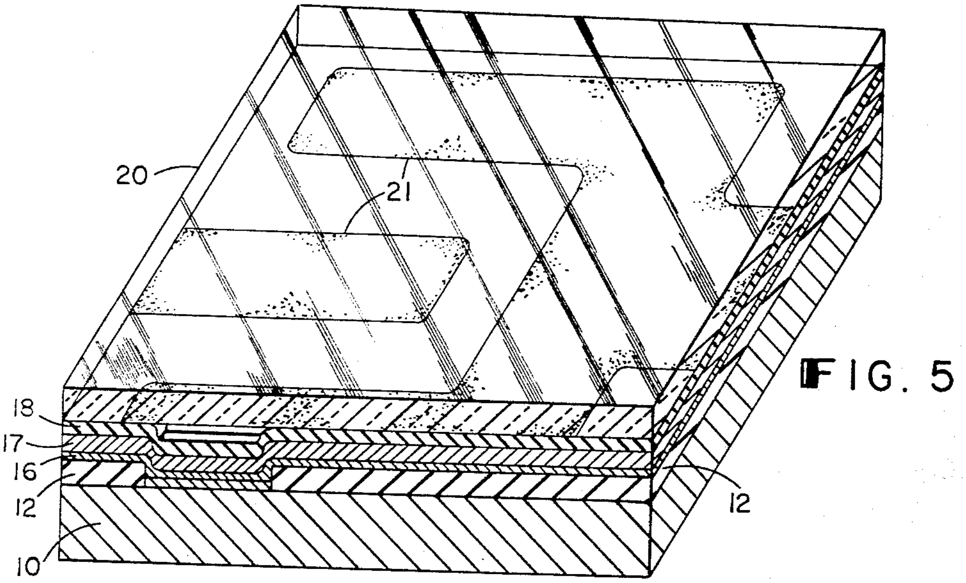

A layer 18 of photosensitive resistant masking material of the type employed in known masking and etching techniques for forming openings in silicon oxide is placed over the surface of the second temporary layer 17 as shown in FIG. 5. Any of the well-known photosensitive polymerizable resistant materials known in the art may be employed. The resistant material is applied as by spinning on or by spraying.

The layer of resistant material is dried and then selectively exposed to ultraviolet light through a mask 20. The mask is of a transparent material, typically glass, and portions 21 of one surface are rendered opaque in a particular predetermined pattern conforming to the pattern of the leads to be produced. The mask is fabricated by employing known photolithographic techniques which enable the opaque areas and the spaces between them to be defined with a high degree of precision.

Figure 6:
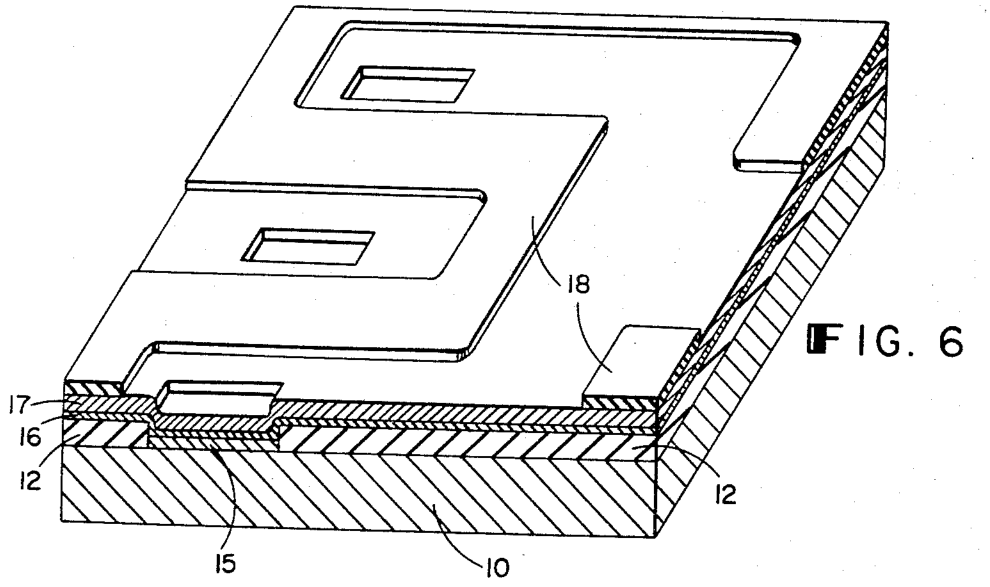

The mask is properly aligned with the silicon wafer by observation of the pattern of the depression in the surface of the resistant material caused by the underlying openings 13 in the silicon oxide. The masked wafer is subjected to ultraviolet light, thus polymerizing the portions of resistant material underlying the transparent regions of the mask. Then the mask is removed, and the wafer is sprayed with a suitable developing solution which washes away the portions of the resistant material which were under the opaque regions of the mask and thus not exposed to the ultraviolet light. The assembly may then be baked to further polymerize and harden the resistant material. The resulting assembly is illustrated in FIG. 6.

Then, the assembly is treated to remove the portions of the second temporary layer 17 not protected by overlying resistant masking material 18. As mentioned above, the second temporary layer may include a thin upper film of aluminum over the layer of copper. An aluminum surface generally provides for better adhesion between the resistant masking material and the second temporary layer during the various treatments of the assembly which follow than does a copper surface. If the second temporary layer does include an upper film of aluminum adherent to the copper, the exposed aluminum is first removed by spraying the assembly with an aqueous solution of 500 grams of C.P. grade sodium hydroxide per 1,000 milliliters of solution for a period of about 2 minutes. The sodium hydroxide solution dissolves aluminum but not the other exposed materials of the assembly.

Figure 7:
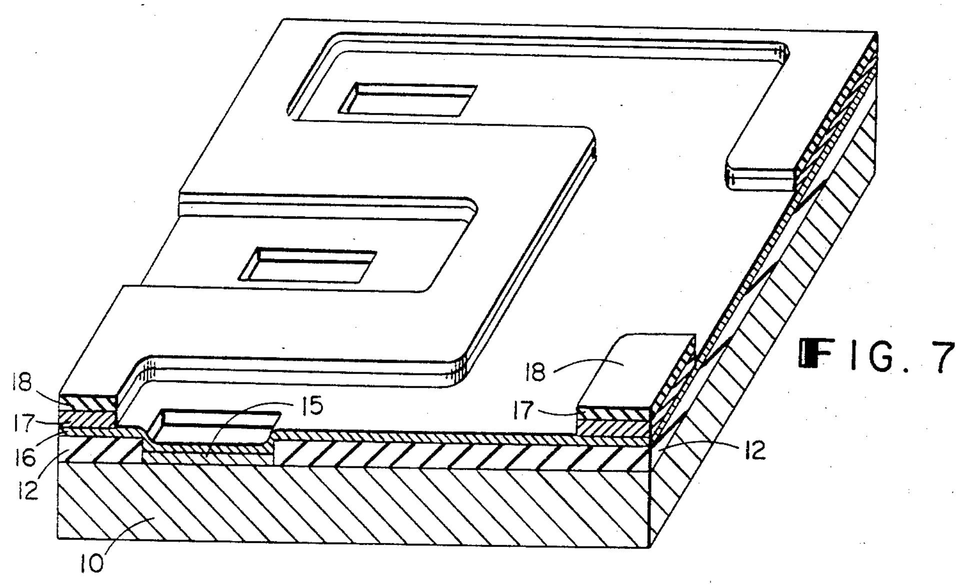

In order to remove the exposed copper of the second temporary layer the wafer is immersed in aqueous solution of 20 grams of ferric nitrate per 1000 milliliters of solution for about ½ minute. The ferric nitrate solution dissolves copper but not the other exposed materials of the assembly. The assembly after removal of the exposed portions of the second temporary layer is shown in FIG. 7.

Figure 8:
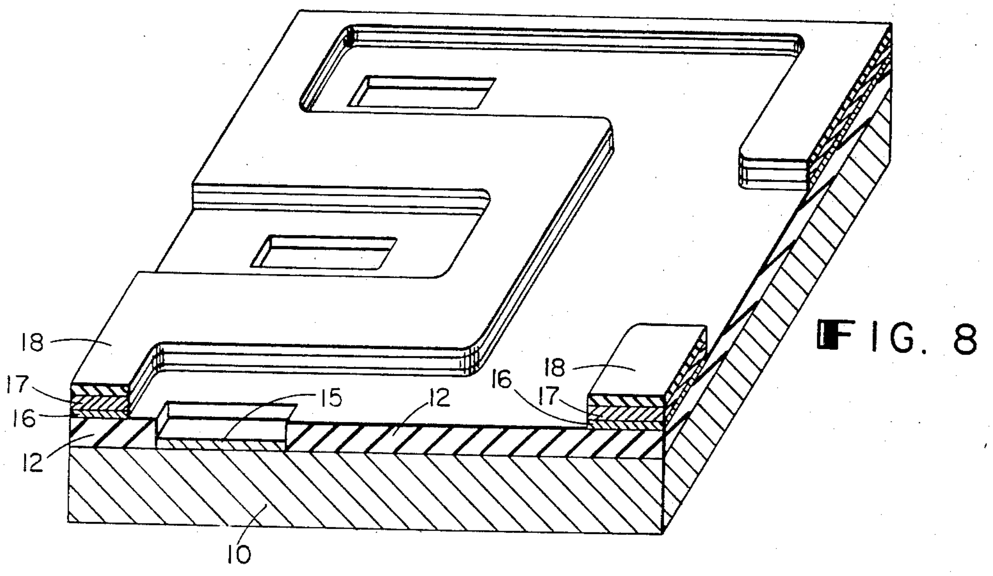

Next, the exposed portions of the first temporary layer 16 which do not underlie the resistant masking material and the remainder of the second temporary layer are removed to expose the underlying portions of the oxide layer 12 and the conductive platinum silicide contacts 15. The assembly is sprayed with an aqueous solution of sodium hydroxide of the same concentration as that described previously for a period of about 2 minutes to remove the exposed aluminum. As shown in FIG. 8 the remainder of each temporary layer 16 and 17 has exposed edges which border the uncovered portions of the surface of the oxide layer 12 and the platinum silicide contacts 15.

Figure 9:
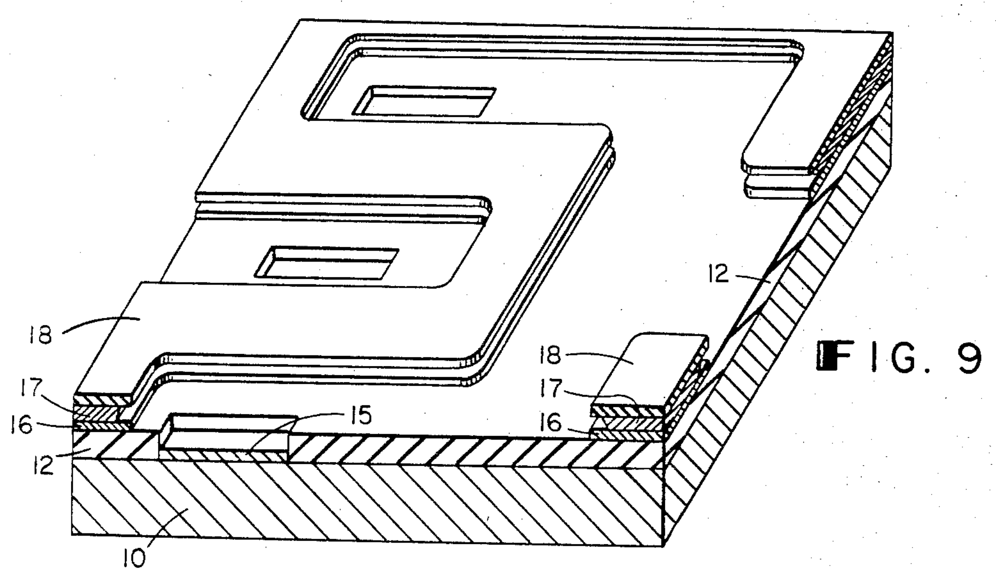
Figure 10:
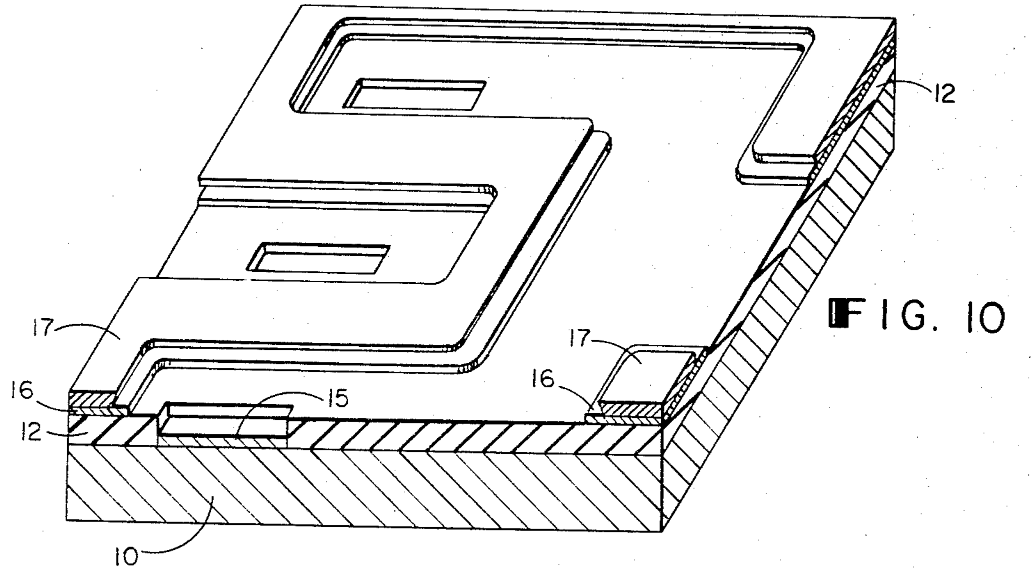

Following the removal of the exposed portions of the first temporary layer, portions of the second temporary layer at its exposed edges are removed to expose peripheral portions of the surface of the remainder of the first temporary layer adjacent the edges of the remainder of the first temporary layer. The edge portions of the copper layer are removed by immersing the assembly for about 5 to 10 seconds in a ferric nitrate solution of the same concentration as that previously employed. As illustrated in FIG. 9 material at the edges of the copper layer 17 is removed so as to expose a surface strip along the border of the aluminum layer 16. The width of the exposed surface strip is of the order of 1 micron.

After the etching treatment and rinsing of the assembly, the resistant masking material 18 is removed by dissolving in a suitable solvent. As can be seen in the portion of the wafer illustrated in FIG. 10 the first temporary layer 16 of aluminum remains over certain predetermined portions of the surface of the oxide coating 12, and its edges border other portions of the oxide coating and the conductive platinum silicide contacts 15 which are exposed in a pattern delineating the leads to be formed. The remainder of the second temporary layer 17 covers the remainder of the first temporary layer except at peripheral portions of the surface of the first temporary layer adjacent the edges of the first temporary layer.

Figure 11:
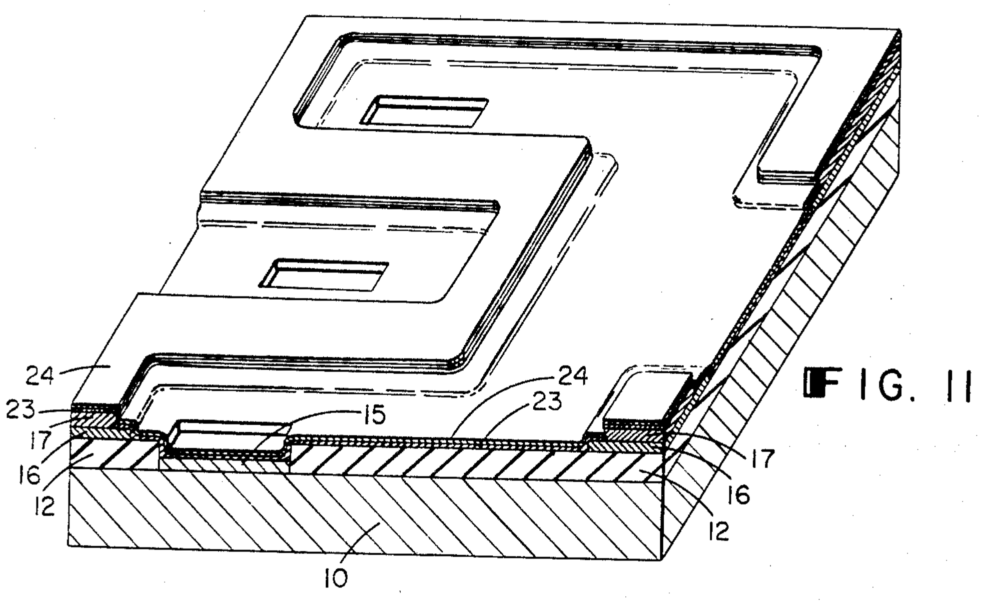

The wafer is placed in a suitable apparatus and a layer of titanium 23 approximately 1500 angstrom units thick is sputtered or evaporated onto the assembly as shown in FIG. 11. Titanium deposits on the exposed surface areas of the oxide coating 12 and the platinum silicide contacts 15 and on the exposed peripheral portions of the first temporary layer 16. Titanium also deposits on the upper surface of the remainder of the second temporary layer 17. Following deposition of the titanium, a layer of platinum 24 approximately 3500 angstrom units thick is sputtered onto the wafer. The platinum deposits on the surface of the titanium layer.

The assembly is then immersed in an aqueous ferric nitrate solution of the same concentration as that employed previously heated to a temperature of about 50° C. The assembly may be ultrasonically agitated while it is immersed in the solution. The ferric nitrate solution dissolves copper but does not attack titanium, platinum, aluminum, or other exposed materials of the assembly. The etching solution attacks the copper layer at the exposed edges. Titanium and platinum may cover some portions of the edges of the copper. However, by virtue of some undercutting at the edges of the copper layer during the previous treatment in ferric nitrate and the copper layer being thicker than the total thickness of the titanium and platinum layers, the edges of the copper layer remain exposed sufficiently to provide adequate surface area for the etching solution to attack the copper. The assembly is immersed in the etching solution for about 5 minutes in order to dissolve the copper.

The assembly is removed from the ferric nitrate bath and the titanium and platinum which had been deposited on the surface of the second temporary layer is readily separated from the assembly, if it has not already been separated by agitation during treatment in the etching solution. These materials may be removed by contacting the exposed upper surface of the assembly with a sheet of flexible material having an adhesive coating on one surface. When the sheet is lifted, the undermined platinum and titanium together with the aluminum film, if any, of the second temporary layer adhere to the adhesive and are peeled from the assembly. The portions of the titanium and platinum layers which adhere to the silicon oxide coating, the platinum silicide contacts, and the peripheral portions of the first temporary layer are not disturbed. The assembly is replaced in the ferric nitrate solution for a period to 1 to 5 minutes in order to remove any trace of copper which might have remained.

Figure 12:
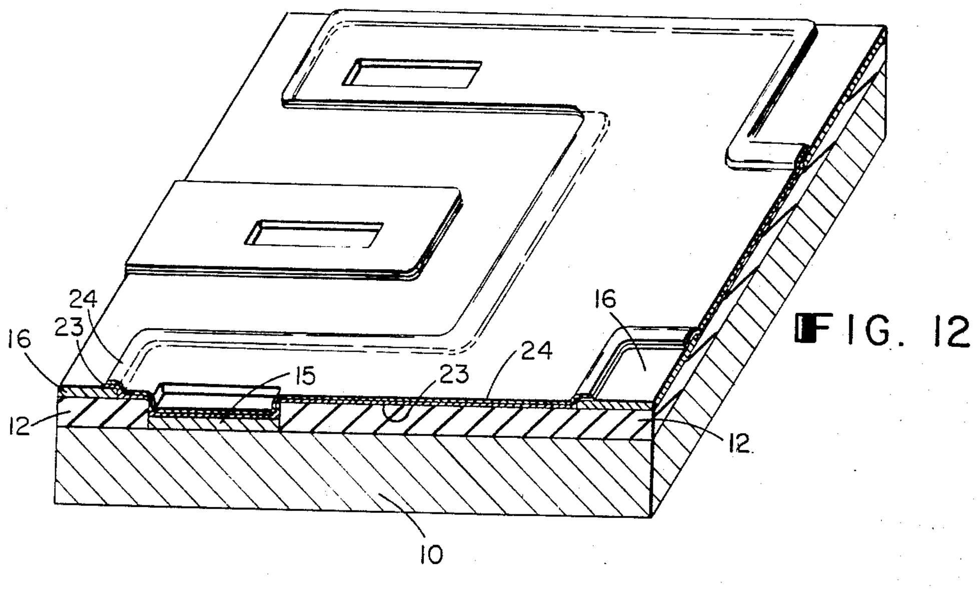

As illustrated in FIG. 12 the plurality of separate segments 23–24 of platinum and underlying titanium which remain are in the pattern of the supporting leads to be formed. They overlie and make physical and electrical connection to the platinum silicide ohmic contacts 15. Each segment extends between two or more of the ohmic contacts delineating an interconnection between the components of the integrated circuit network, or extends from an ohmic contact delineating a lead for a connection externally of the circuit network. Each of the segments also overlies a peripheral portion of the surface of the remainder of the adherent first temporary layer 16 thereby establishing electrical contact between each of the segments and the first temporary layer and providing electrical connection from each segment to every other segment.

Figure 13:
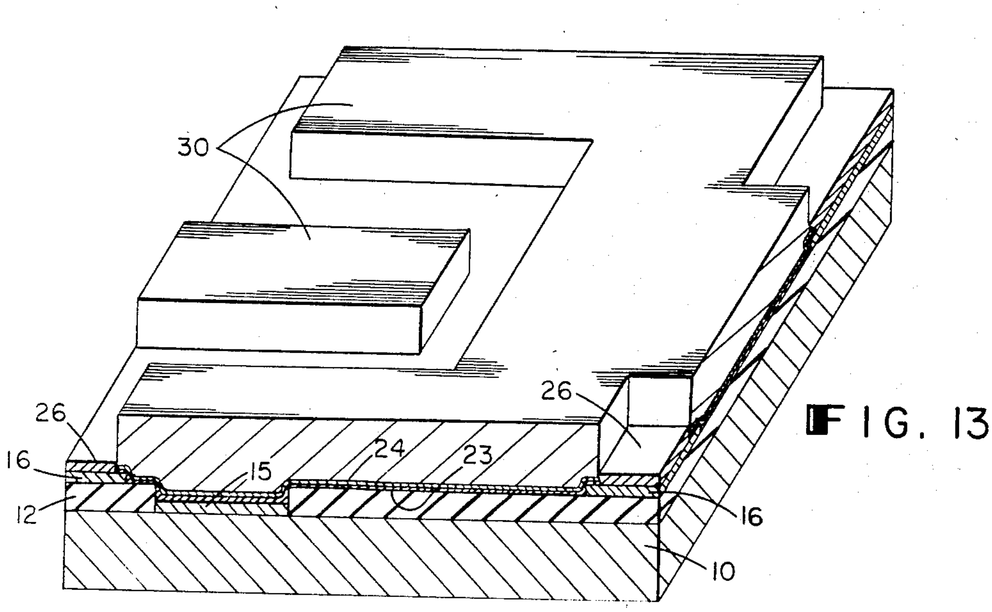

The assembly is immersed in a gold plating solution, for example, a standard citric acid gold plating bath. A cathode connection is made to the aluminum of the first temporary layer near the edge of the wafer. A non-conductive coating of aluminum oxide 26 is present on the exposed surface of the aluminum layer 16 during plating. A satisfactory coating may be produced merely by exposure of the aluminum to the atmosphere. Additional oxidation of the aluminum surface takes place in the citric acid plating bath. Thus, gold deposits on the exposed conductive surfaces of the platinum layer but does not deposit on the aluminum which is protected by the non-conductive coating of aluminum oxide. Electroplating is carried out under appropriate conditions of current flow and for a suitable time in accordance with the surface area of the platinum so as to produce gold members 30 approximately .2 to .3 mil thick overlying the titanium and platinum segments as shown in FIG. 13.

Following plating of the gold leads and suitable rinsing of the assembly, the remainder of the first temporary layer 16 and the non-conductive coating 26 are removed. The assembly is treated by spraying for about 2 minutes with a sodium hydroxide solution as employed previously. The aluminum together with the aluminum oxide coating is completely removed exposing the underlying silicon oxide layer 12 as illustrated in FIG. 14. Supporting leads 30 having a thin layer of titanium, a thin layer of platinum, and a thick layer of gold remain in a pattern determined by the opaque regions of the mask 20.

The nature of the titanium-platinum-gold combination is as known in supporting lead devices fabricated by prior art processes. The titanium provides good adherence between the leads and the oxide coating as well as between the leads and the platinum silicide. The platinum provides good adherence of the gold to the titanium. In addition, since the titanium is porous, without the platinum layer gold would tend to alloy with the silicon oxide underlying the titanium.

After formation of the supporting leads according to the method of the invention, the wafer is processed in accordance with known techniques to divide the wafer into individual integrated circuit networks. The entire upper surface of the wafer is masked with a suitable resistant material and the wafer is subjected to an etching solution which dissolves silicon from the undersurface of the wafer to reduce the silicon wafer to a thickness of about 2 mils. The undersurface of the wafer is then suitably masked and subjected to sand blasting to form grooves in the wafer encircling regions of the wafer which are to be separated into individual bodies of silicon. When the thickness of the silicon in the grooves is approximately ½ mil, sand blasting is discontinued and the masked wafer is subjected to an etching solution to remove the final ½ mil of silicon.

The wafer is thus separated into a plurality of identical integrated circuit networks, each network having a plurality of individual isolated bodies 10 of silicon held together by the supporting leads 30. A single integrated circuit network is illustrated in FIG. 15, the dashed lines labeled "A" indicating the section which is shown in various stages of the process of the invention in FIGS. 1B through 14. The portions of the leads 30 extending outwardly from the silicon bodies serve as external contacts for the circuit. They may be directly connected, as by welding, to an array of leads or other conductive members in the enclosure in which the circuit network is mounted.

The method of the invention thus provides a technique for fabricating supporting leads on semiconductor devices in which the various processing steps and the materials employed are compatible. The process is a combination of individually well established techniques of photosensitive resist masking, etching, and depositing materials by sputtering, evaporating and electroplating. After a material constituting a portion of the leads in their final form is added to the assembly, the assembly is not subjected to a material or process having a deleterious effect on that material. Thus, the resulting leads are well defined, uniform, have good physical characteristics, and are strongly adherent to the body of semiconductor material. In addition, in carrying out the method of the invention alignment between the semiconductor wafer and a mask is required at only one stage. All the other steps of the process are performed with no need for precise arrangement of parts or apparatus.

While there has been shown and described what is considered a preferred embodiment of the present invention, it will be obvious to those skilled in the art that various changes and modifications may be made therein without departing from the invention as defined in the appended claims.

What is claimed is:

1. The method of forming connecting leads to a body of semiconductor material having a surface coated with an adherent layer of a non-conductive material interspersed with conductive contacts in ohmic connection with underlying portions of said body including the steps of placing a first temporary layer of a first conductive material and an overlying second temporary layer of material on predetermined portions of the surface of the layer of nonconductive material leaving exposed other portions of the surface of the layer of non-conductive material and at least portions of the conductive contacts delineating areas on which the connecting leads are to be formed, said temporary layers each having edges bordering the exposed portions of the surface of the layer of non-conductive material and the conductive contacts, removing portions of the second temporary layer at said edges to expose peripheral portions of the surface of the first temporary layer adjacent the edges of the first temporary layer, placing conductive material on the exposed portions of the surface of the layer of non-conductive material and the conductive contacts, on said peripheral portions of the surface of the first temporary layer, and on the surface of the second temporary layer, subjecting the assembly to etching material capable of dissolving material of the second temporary layer but not the other exposed materials of the assembly to remove the second temporary layer and the overlying conductive material whereby conductive material remains on other portions of the surface of the layer of non-conductive material and the conductive contacts and on said peripheral portions of the surface of the first temporary layer, forming a non-conductive coating on the exposed surface of the first temporary layer of first conductive material, electroplating a conductive material onto the exposed conductive material to provide conductive members overlying the portions of the surface of the layer of non-conductive material and the conductive contacts, and removing the first conductive material of the first temporary layer and the non-conductive coating.

2. The method of forming connecting leads to a body of semiconductor material having a surface coated with an adherent layer of a non-conductive material interspersed with conductive contacts in ohmic connection with underlying portions of said body including the steps of depositing a first conductive material to form a first temporary layer over the entire surface of the layer of nonconductive material and the conductive contacts;

depositing material to form a second temporary layer over the entire surface of the first temporary layer;

placing a masking material on predetermined portions of the second temporary layer overlying predetermined portions of the layer of non-conductive material and leaving exposed other portions of the second temporary layer overlying other portions of the layer of non-conductive material and at least portions of the conductive contacts, said last-mentioned portions of the layer of non-conductive material and the conductive contacts being the areas on which connecting leads are to be formed;

subjecting the assembly to etching material capable of dissolving material of the second temporary layer but not the other exposed materials of the assembly to remove the exposed portions of the second temporary layer exposing portions of the surface of the first temporary layer overlying the portions of the layer of non-conductive material and the conductive contacts on which the connecting leads are to be formed and forming exposed edges of the remainder of the second temporary layer bordering the exposed portions of the first temporary layer;

subjecting the assembly to an etching medium capable of dissolving the first conductive material but not the other exposed materials of the assembly to remove the exposed portions of the first temporary layer exposing portions of the layer of non-conductive material and the conductive contacts and forming edges of the remainder of the first temporary layer bordering the exposed portions of the layer of non-conductive material and the conductive contacts;

subjecting the assembly to etching material capable of dissolving material of the second temporary layer but not the other exposed materials of the assembly to remove portions of the second temporary layer at said exposed edges and expose peripheral portions of the surface of the remainder of the first temporary layer adjacent the edges of the remainder of the first temporary layer;

removing the masking material;

depositing conductive material on the exposed portions of the surface of the layer of non-conductive material and the conductive contacts, on said peripheral portions of the surface of the remainder of the first temporary layer, and on the surface of the remainder of the second temporary layer;

subjecting the assembly to etching material capable of dissolving material of the second temporary layer but not the other exposed materials of the assembly to remove the remainder of the second temporary layer and the overlying conductive material whereby segments of conductive material remain on portions of the layer of non-conductive material and the conductive contacts and on said peripheral portions of the surface of the remainder of the first temporary layer;

forming a non-conductive coating on the exposed surface of the remainder of the first temporary layer of first conductive material;

electroplating a conductive material onto the exposed conductive material to provide conductive members on said segments; and subjecting the assembly to etching material capable of dissolving the non-conductive coating and the first conductive material but not the other exposed materials of the assembly to remove the remainder of the first temporary layer.

3. The method of forming connecting leads to a body of semiconductor material according to claim 2 in which said second temporary layer includes a layer of a second temporary material covering the entire surface of the first temporary layer and a film of a third temporary material over the entire surface of the layer of second temporary material;

the step of subjecting the assembly to etching material capable of dissolving material of the second temporary layer but not the other exposed materials of the assembly to remove the exposed portions of the second temporary layer exposing portions of the surface of the first temporary layer overlying the portions of the layer of non-conductive material and the conductive contacts on which the connecting leads are to be formed and forming exposed edges of the remainder of the second temporary layer bordering the exposed portions of the first temporary layer is performed in two stages by subjecting the assembly to a first etching solution capable of dissolving the third temporary material of the second temporary layer but not the second temporary material to remove the exposed portions of the film of the third temporary material and expose portions of the layer of the second temporary material, and subjecting the assembly to second etching solution capable of dissolving the second temporary material of the second temporary layer but not the third temporary material to remove the exposed portions of the layer of the second temporary material and expose portions of the surface of the first temporary layer; and the etching material capable of dissolving material of the second temporary layer but not the other exposed materials of the assembly to which the assembly is subjected to remove portions of the second temporary layer at the exposed edges and expose peripheral portions of the surface of the remainder of the first temporary layer adjacent the edges of the remainder of the first temporary layer is an etching solution capable of dissolving the second temporary material of the second temporary layer but not the third temporary material.

4. The method of producing semiconductor devices having connecting leads attached thereto including the steps of providing a body of semiconductor material having a surface coated with an adherent layer of a non-conductive material having openings therein exposing surface areas of said body;

establishing conductive contacts at the exposed surface areas in ohmic contact with the semiconductor material at the exposed surface areas;

depositing a first conductive material to form a first temporary layer over the entire surface of the layer of nonconductive material and the conductive contacts;

depositing material to form a second temporary layer over the entire surface of the first temporary layer;

placing a masking material on predetermined portions of the second temporary layer overlying predetermined portions of the layer of non-conductive material and leaving exposed other portions of the second temporary layer overlying other portions of the layer of non-conductive material and at least portions of the conductive contacts, said last-mentioned portions of the layer of non-conductive material and the conductive contacts being the areas on which connecting leads are to be formed;

subecting the assembly to etching material capable of dissolving material of the second temporary layer but not the other exposed materials of the assembly to remove the exposed portions of the second temporary layer exposing portions of the surface of the first temporary layer overlying the portions of the layer of non-conductive material and the conductive contacts on which the connecting leads are to be formed and forming exposed edges of the remainder of the second temporary layer bordering the exposed portions of the first temporary layer;

subjecting the assembly to an etching medium capable of dissolving the first conductive material but not the other exposed materials of the assembly to remove the exposed portions of the first temporary layer exposing portions of the layer of non-conductive material and the conductive contacts and forming edges of the remainder of the first temporary layer bordering the exposed portions of the layer of non-conductive material and the conductive contacts;

subjecting the assembly to etching material capable of dissolving material of the second temporary layer but not the other exposed materials of the assembly to remove portions of the second temporary layer at said exposed edges and expose peripheral portions of the surface of the remainder of the first temporary layer adjacent the edges of the remainder of the first temporary layer;

removing the masking material;

depositing conductive material on the exposed portions of the surface of the layer of non-conductive material and the conductive contacts, on said peripheral portions of the surface of the remainder of the first temporary layer, and on the surface of the remainder of the second temporary layer;

the thickness of the last-mentioned conductive material being less than the thickness of the second temporary layer;

subjecting the assembly to etching material capable of dissolving material of the second temporary layer but not the other exposed materials of the assembly to remove the remainder of the second temporary layer and the overlying conductive material whereby segments of conductive material remain on portions of the layer of non-conductive material and the conductive contacts and on said peripheral portions of the surface of the remainder of the first temporary layer;

forming a non-conductive coating on the exposed surface of the remainder of the first temporary layer of first conductive material;

electroplating a conductive material onto the assembly whereby conductive material deposits on said segments to form conductive leads overlying the portions of the layer of non-conductive material and the conductive contacts; and subjecting the assembly to etching material capable of dissolving the non-conductive coating and the first conductive material but not the other exposed materials of the assembly to remove the remainder of the first temporary layer.

5. The method of producing semiconductor devices having connecting leads attached thereto according to claim 4 in which said second temporary layer includes a layer of a second temporary material covering the entire surface of the first temporary layer and a film of a third temporary material over the entire surface of the layer of second temporary material;

the step of subjecting the assembly to etching material capable of dissolving material of the second temporary layer but not the other exposed materials of the assembly to remove the exposed portions of the second temporary layer exposing portions of the surface of the first temporary layer overlying the portions of the layer of non-conductive material and the conductive contacts on which the connecting leads are to be formed and forming exposed edges of the remainder of the second temporary layer bordering the exposed portions of the first temporary layer is performed in two stages by subjecting the assembly to a first etching solution capable of dissolving the third temporary material of the second temporary layer but not the second temporary material to remove the exposed portions of the film of the third temporary material and expose portions of the layer of the second temporary material, and subjecting the assembly to a second etching solution capable of dissolving the second temporary material of the second temporary layer but not the third temporary material to remove the exposed portions of the layer of the second temporary material and expose portions of the surface of the first temporary layer;

the etching material capable of dissolving material of the second temporary layer but not the other exposed materials of the assembly to which the assembly is subjected to remove portions of the second temporary layer at said exposed edges and expose peripheral portions of the surface of the remainder of the first temporary layer adjacent the edges of the remainder of the first temporary layer is an etching solution capable of dissolving the second temporary material of the second temporary layer but not the third temporary material;

the thickness of the conductive material deposited on the exposed portions of the surface of the layer of non-conductive material and the conductive contacts, on said peripheral portions of the surface of the remainder of the first temporary layer, and on the surface of the remainder of the second temporary layer is less than the thickness of the layer of the second temporary material; and the etching material capable of dissolving material of the second temporary layer but not the other exposed materials of the assembly to which the assembly is subjected to remove the remainder of the second temporary layer and the overlying conductive material is an etching solution capable of dissolving the second temporary material of the second temporary layer but not the third temporary material.

6. The method of producing semiconductor devices having connecting leads attached thereto including the steps of providing a body of semiconductor material having a surface coated with an adherent layer of a non-conductive material having openings therein exposing surface areas of said body;

establishing conductive contacts at the exposed surface areas in ohmic contact with the semiconductor material at the exposed surface areas;

depositing aluminum to form a first temporary layer over the entire surface of the layer of non-conductive material and the conductive contacts;

depositing copper to form a second temporary layer over the entire surface of the first temporary layer;

placing a masking coating adherent to predetermined portions of the layer of copper overlying predetermined portions of the layer of non-conductive material and leaving exposed other portions of the layer of copper overlying other portions of the layer of non-conductive material and at least portions of the conductive contacts, said last-mentioned portions of the layer of non-conductive material and the conductive contacts being the areas on which connecting leads are to be formed;

subjecting the assembly to an etching medium capable of dissolving copper but not the other exposed materials of the assembly to remove the exposed portions of the layer of copper exposing portions of the surface of the layer of aluminum overlying the portions of the layer of non-conductive material and the conductive contacts on which the connecting leads are to be formed and forming exposed edges of the remainder of the layer of copper bordering the exposed portions of the layer of aluminum;

subjecting the assembly to an etching medium capable of dissolving aluminum but not the other exposed materials of the assembly to remove the exposed portions of the layer of aluminum exposing portions of the layer of non-conductive material and the conductive contacts and forming edges of the remainder of the layer of aluminum bordering the exposed portions of the layer of non-conductive material and the conductive contacts;

subjecting the assembly to an etching medium capable of dissolving copper but not the other exposed materials of the assembly to remove portions of the layer of copper at said exposed edges and expose peripheral portions of the surface of the remainder of the layer of aluminum adjacent the edges of the remainder of the layer of aluminum;

removing the masking coating;

depositing a layer of titanium on the exposed portions of the surface of the layer of non-conductive material and the conductive contacts, on said peripheral portions of the surface of the remainder of the layer of aluminum, and on the surface of the remainder of the layer of copper;

depositing a layer of platinum on the layer of titanium;

the total thickness of the layers of titanium and platinum being less than the thickness of the layer of copper;

subjecting the assembly to an etching medium capable of dissolving copper but not the other exposed materials of the assembly to remove the remainder of the copper and the overlying titanium and platinum whereby segments of titanium and platinum remain on portions of the layer of non-conductive material and the conductive contacts and on said peripheral portions of the surface of the remainder of the layer of aluminum;

oxidizing the exposed surface of the remainder of the layer of aluminum to form a non-conductive coating;

electroplating the assembly in a gold plating solution whereby gold deposits on said segments to form conductive leads overlying the portions of the surface of the non-conductive coating and the conductive contacts; and subjecting the assembly to etching material capable of dissolving the non-conductive coating and aluminum but not the other exposed materials of the assembly to remove the remainder of the aluminum.

References Cited

UNITED STATES PATENTS

| | | | |
|---|---|---|---|
| 2,793,420 | 5/1957 | Johnson et al. | 29—590 |
| 2,916,806 | 12/1959 | Pudvin | 29—590 |
| 3,108,359 | 10/1963 | Moore et al. | 29—589 |
| 3,266,127 | 8/1966 | Harding et al. | 29—590 XR |

JOHN F. CAMPBELL, *Primary Examiner.*

R. B. LAZARUS, *Assistant Examiner.*

U.S. Cl. X.R.

29—578